United States Patent
Wiggins

(10) Patent No.: US 6,936,481 B2
(45) Date of Patent: Aug. 30, 2005

(54) METHOD OF DEPOSITING DIELECTRIC

(75) Inventor: Claire Louise Wiggins, Grantham (GB)

(73) Assignee: Trikon Holdings Limited, Newport (GB)

( * ) Notice: Subject to any disclaimer, the term of this patent is extended or adjusted under 35 U.S.C. 154(b) by 0 days.

(21) Appl. No.: 10/336,923

(22) Filed: Jan. 6, 2003

(65) Prior Publication Data

US 2003/0096508 A1 May 22, 2003

Related U.S. Application Data

(63) Continuation of application No. 09/832,942, filed on Apr. 12, 2001, now abandoned.

(30) Foreign Application Priority Data

Apr. 14, 2000 (GB) .............................................. 0009139

(51) Int. Cl.[7] .............................................. H01L 21/00
(52) U.S. Cl. .......................................... 438/10; 438/400
(58) Field of Search .............................. 438/5, 10, 400

(56) References Cited

U.S. PATENT DOCUMENTS

| | | | |
|---|---|---|---|
| 4,002,545 A | 1/1977 | Fehiner et al. ............... | 524/492 |
| 4,959,745 A | 9/1990 | Suguro ........................ | 361/311 |
| 5,078,846 A | 1/1992 | Miller et al. ............... | 204/192.2 |
| 5,180,476 A | 1/1993 | Ishibashi et al. ........ | 204/192.29 |
| 5,185,689 A | 2/1993 | Maniar ........................ | 361/313 |
| 5,286,531 A | 2/1994 | Krug et al. .................. | 427/536 |
| 5,559,058 A * | 9/1996 | Zory et al. ...................... | 438/10 |
| 5,789,071 A | 8/1998 | Sproul et al. ................ | 428/216 |
| 5,942,089 A | 8/1999 | Sproul et al. .......... | 204/192.13 |
| 6,075,691 A | 6/2000 | Duenas et al. ........... | 361/321.5 |
| 6,171,872 B1 * | 1/2001 | Lowrey et al. ................ | 438/10 |
| 6,211,035 B1 | 4/2001 | Moise et al. ................ | 438/396 |
| 6,246,076 B1 | 6/2001 | Lipkin et al. .................. | 257/77 |
| 6,266,230 B1 | 7/2001 | Kato et al. | |
| 6,291,867 B1 | 9/2001 | Wallace et al. ............. | 257/410 |
| 6,319,766 B1 * | 11/2001 | Bakli et al. .................. | 438/240 |
| 6,346,427 B1 * | 2/2002 | Gardner et al. ................ | 438/10 |
| 6,407,420 B1 * | 6/2002 | Yamanaka et al. .......... | 257/296 |
| 6,537,428 B1 * | 3/2003 | Xiong et al. ........... | 204/192.13 |
| 6,622,059 B1 * | 9/2003 | Toprac et al. ................ | 700/121 |
| 6,624,462 B1 * | 9/2003 | Kohara et al. .............. | 257/310 |
| 6,730,955 B2 * | 5/2004 | Shinohara et al. .......... | 257/306 |

FOREIGN PATENT DOCUMENTS

EP 0 691 419 A1 1/1996
JP 2000-82630 3/2000

* cited by examiner

*Primary Examiner*—W. David Coleman
(74) *Attorney, Agent, or Firm*—Volentine Francos & Whitt PLLC

(57) ABSTRACT

This invention relates to a method of depositing dielectric on a semiconductor substrate to form part of a capacitor. The method includes reactive sputtering a metal oxide layer from a target of metal onto the substrate wherein the support is biased to induce a DC voltage across the depositing dielectric as it forms. The voltage may be in the range of 200–300V.

23 Claims, 1 Drawing Sheet

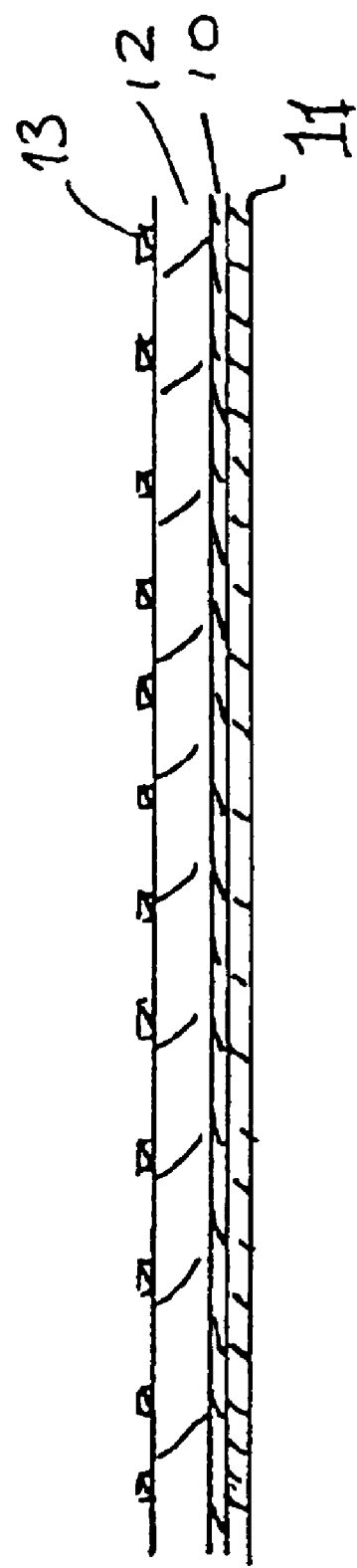

METHOD OF DEPOSITING DIELECTRIC

CROSS-REFERENCE TO RELATED APPLICATIONS

This is a continuation of application Ser. No. 09/832,942, filed Apr. 12, 2001, now abandoned, which is incorporated herein by reference in its entirety.

BACKGROUND OF THE INVENTION

This invention relates to a method of depositing dielectric on a semiconductor substrate to form part of a capacitor.

In order to reduce the size of capacitors required in semiconductor devices the industry is moving towards the use of high dielectric constant (k) materials. One Particular favoured material is Tantalum Pentoxide ($Ta_2O_5$) is a particularly promising candidate with a dielectric constant of about 25. This material can be deposited by various chemical and physical means, but the most convenient for semiconductor work is vapour deposition. This process is well known in general and is for example described in U.S. Pat. No. 5,111,355. From this it will be seen that Tantalum is one of a class of materials in which the oxide forms on the surface of the metal target and is sputtered from the target, in contrast to other reactive processes where the oxide or nitride is formed in flight or on the surface of the substrate. Possibly because of this factor problems can arise from a relatively high leakage current through the deposited layer. As will be seen in U.S. Pat. No. 5,872,696 it is thought that this is in part due to pin holes and in part due to the presence of un-oxidised Tantalum atoms within the layer linking to form a leakage path. In that Patent a reduction of the leakage current is achieved by further anodisation of the Tantalum Pentoxide. This reduces the pinholes and/or the conductive paths sufficiently to allow large area capacitors to be formed. However, with small area capacitors relatively high leakage currents (of the order of $>1^{-6}$ amps when 5 volts is applied against a layer of 100 thickness of Tantalum Pentoxide).

SUMMARY OF THE INVENTION

The present invention consists in a method of depositing dielectric on a semiconductor substrate on a support to form part of a capacitor including reactive sputtering the metal oxide layer from a target of the metal onto the substrate characterised in that the support is bias to induce a DC voltage across the deposited dielectric as it forms.

The induced voltage may be in the range of 200–300 volts and to achieve this the support may be bias by means of an RF or pulse DC power supply. The target may also be bias by an RV or pulse DC power supply, the pulsed supply is preferred.

The method may further include the step of plasma oxidation of the deposited oxide after or during deposition.

The dielectric layer may be deposited on the first electrode and discrete second electrodes may be deposited on the upper surface to define a plurality of capacitors. The area of each second electrode may be less than 0.01 $cm^2$ and capacitors have been formed with second electrode areas of 0.008 $cm^2$.

In a preferred embodiment the metal oxide is Tantalum Pentoxide, but it is believed that the method will show improvements with any metal oxide which is reactive sputtered from the target.

Although the invention has been defined above it is to be understood it includes any inventive combination of the features set out above or in the following description.

BRIEF DESCRIPTION OF THE DRAWINGS

The invention may be performed in various ways and a specific embodiment will now be described, by way of example with reference to the accompanying drawing which is a schematic cross-section through an array of capacitors formed in accordance with the invention.

DETAILED DESCRIPTION OF THE PREFERRED EMBODIMENTS

The process of reactive sputtering is well known and is, for example, described at pages 48 to 53, pages 107 to 109 in Thin Film Processes edited by John L. Vossen and Werner Kern and published 1978 by Academic Press, Inc. This disclosure is herein incorporated by reference. As has already been mentioned U.S. Pat. No. 5,872,696 specifically describes the reactive sputtering of Tantalum Pentoxide.

As can be seen in the figure the Applicants deposit a first electrode 10, (typically of Titanium Nitride) onto the surface of a substrate 11 and onto this they reactively sputter Tantalum Pentoxide 12 to form a dielectric layer. Second electrodes are then formed by depositing dots 13 of Titanium Nitride through an aperture mask. Each dot then defines a single capacitor formed by the respective dot 13 the underlying area of the first electrode 10 and the intermediate portion of dielectric 12.

In the Applicants set up the target electrode for the reactive deposition was powered by pulsed DC.

Two experiments were then run on identical ("same lot") wafers using the following conditions except that in one part of the experiment the support on which the substrate sits was not biased, whereas in the second experiment it was biased as indicated:

Test Structure:
Lower electrode TiN
Dielectric $Ta_2O_5$ generally 100 Å to 100 Å thick, typically 500 Å through different applications may require 1 micron thickness and the result reported below was for 100 Å. In general thinner layers are preferred.
Upper electrode For testing of the dielectric a TiN layer is deposited through an aperture mask to define capacitance dots of area 0.008 $cm^2$.
Experimental Process:
Reactive Deposition of 600 Å Tantalum Pentoxide
Target power 2 kw DC, pulsed at 1000 kHz with a pulse width of 4000 nanoseconds
Argon flow 50 sccm
Oxygen flow 40 sccm
Platen temperature 300° C.
Platen bias power 600 W 13.65 mhz RF inducing 270 v dc bias
Process time 150 seconds
Wafer size: 150 mm silicon
Plasma Oxidation of the Tantalum Pentoxide deposited as above:
Oxygen flow 200 sccm
Inductive coil power 500 watts, 'soft started' at 400 watts then increased 1 minute process
Power density is an important characteristic and for different size wafers and chambers other power levels would be appropriate and can be determined experimentally.

The capacitance dots 13 were probed under the application of 5 volts and the leakage current measured. The batch of capacitors which had been formed without biasing the support had a leakage current $>1^{-6}$ amps whereas those formed under the bias conditions had a leakage current of $<1^{-8}$ amps. In each case the thickness of the Tantalum Pentoxide was 100 Å.

It will be noted that in each case the anodising step of U.S. Pat. No. 5,872,696 was carried out, but the leakage current was substantially improved under bias conditions. This strongly suggests that quite a different process is occurring in the Applicants invention and it is believed that this may result in an improved density in the deposited layer. It will be appreciated that the orders of magnitude improvement in leakage current means that the Applicants have found a way of significantly improving the performance of capacitors of this type.

What is claimed is:

1. A method of depositing a dielectric on a semiconductor substrate on a support to form part of a capacitor including reactive sputtering a metal oxide layer from a target of the metal onto the substrate characterized in that this support is biased to induce a DC voltage across the depositing dielectric as it forms.

2. A method as claimed in claim 1 wherein the induced voltage is in the range of 200 to 300 volts.

3. A method as claimed in claim 1 wherein the support is biased by means of an RF or pulsed DC power supply.

4. A method as claimed in claim 1 wherein the target is biased by an RF or pulsed DC power supply.

5. A method as claimed in claim 1 further including plasma oxidation of the oxide after or during deposition.

6. A method as claimed in claim 1 wherein the dielectric is deposited on a first electrode and discrete second electrodes are deposited on the upper surface to define a plurality of capacitors.

7. A method as claimed in claim 6 wherein the area of each second electrode is less than 0.01 cm$^2$.

8. A method as claimed in claim 1, wherein the metal oxide is Tantalum Pentoxide.

9. A method of forming a dielectric layer, comprising situating a semiconductor substrate against a support within a processing chamber;

reactive sputtering a layer of metal oxide on a surface of the substrate situated against the support using a target of the metal which is spaced within the chamber from the support; and while the metal oxide layer is being sputtered on the surface of the substrate, biasing the support against which the substrate is situated to induce a DC voltage across the metal oxide layer as the metal oxide layer is being formed.

10. A method as claimed in claim 9, wherein the induced DC voltage is in the range of 200 to 300 Volts.

11. A method as claimed in claim 9, wherein said biasing of the support comprises delivering power to the support from an RF or pulsed DC power supply.

12. A method as claimed in claim 10, wherein said biasing of the support comprises delivering power to the support from an RF or pulsed DC power supply.

13. A method as claimed in claim 9, further comprising biasing the target, using an RF or pulsed DC power supply, during said reactive sputtering of the metal oxide layer.

14. A method as claimed in claim 9, further comprising plasma oxidation of the metal oxide after or during said sputtering of the metal oxide layer onto the surface of the substrate.

15. A method as claimed in claim 9, wherein the metal oxide layer is a Tantalum Pentoxide layer.

16. A method of forming a plurality of capacitors, comprising:

situating a semiconductor substrate against a support within a processing chamber, wherein the semiconductor substrate has an electrically conductive layer which constitutes a first electrode, and wherein the electrically conductive layer has an exposed surface facing away from the support;

reactive sputtering a layer of metal oxide on the exposed surface of the electrically conductive layer of the substrate situated against the support using a target of the metal which is spaced within the chamber from the support;

while the metal oxide layer is being formed on the first electrode, biasing the support against which the substrate is situated to induce a DC voltage across the metal oxide layer as the metal oxide layer is being formed; and forming a plurality of second electrodes which are spaced apart from one another across a surface of the metal oxide layer such that the metal oxide layer is interposed between the second electrodes and the first electrode.

17. A method as claimed in claim 16, wherein the induced DC voltage is in the range of 200 to 300 Volts.

18. A method as claimed in claim 16, wherein said biasing of the support comprises delivering power to the support from an RF or pulsed DC power supply.

19. A method as claimed in claim 16, further comprising biasing the target, using an RF or pulsed DC power supply, during said reactive sputtering of the metal oxide layer.

20. A method as claimed in claim 16, further comprising plasma oxidation of the metal oxide layer after or during the sputtering of the metal oxide layer onto said surface of the substrate.

21. A method as claimed in claim 16, wherein the metal oxide layer is a Tantalum Pentoxide layer.

22. A method as claimed in claim 17, wherein said biasing of the support comprises delivering power to the support from an RF or pulsed DC power supply.

23. A method as claimed in claim 22, wherein an area of each of the second electrodes over of the surface of the metal oxide layer is less than 0.01 cm$^2$.

* * * * *